United States Patent [19]

Cosimano et al.

[11] Patent Number: 5,214,572
[45] Date of Patent: May 25, 1993

[54] ONE-PIECE ELECTRONIC CAGE

[75] Inventors: Raymond J. Cosimano; Gerald J. Demorat; William F. Ott, III, all of Endicott, N.Y.; Robert C. Reinhart, San Jose, Calif.

[73] Assignee: International Business Machines Corporation, Armonk, N.Y.

[21] Appl. No.: 747,825

[22] Filed: Aug. 21, 1991

[51] Int. Cl.$^5$ .................. H05K 7/14; H05K 5/00; H01R 9/09
[52] U.S. Cl. .................. 361/415; 211/41; 361/390; 361/412; 361/413; 439/59; 439/61; 439/62
[58] Field of Search ............... 211/41; 361/415, 390, 361/394, 399, 424, 412, 413; 439/59, 60, 61, 62; 379/223, 224, 227

[56] References Cited

U.S. PATENT DOCUMENTS

| | | |
|---|---|---|
| 3,231,785 | 1/1966 | Calabro . |
| 3,382,476 | 5/1968 | Novet . |
| 3,500,131 | 3/1970 | Seeley et al. . |
| 3,676,746 | 7/1972 | Kassabgi et al. . |
| 3,760,486 | 9/1973 | Rifkin et al. . |
| 4,109,194 | 8/1978 | Mason . |
| 4,153,127 | 5/1979 | Klink et al. ............ 361/392 X |
| 4,261,464 | 4/1981 | Maitland ............ 211/41 X |
| 4,694,380 | 9/1987 | Mallory et al. ............ 361/424 |
| 4,717,216 | 1/1988 | Hornak ............ 211/41 X |
| 4,829,402 | 5/1989 | Gewebler et al. . |
| 4,837,664 | 6/1989 | Rodriguez II, et al. ....... 361/424 X |
| 4,984,133 | 1/1991 | Casanova et al. . |

FOREIGN PATENT DOCUMENTS

| | | |
|---|---|---|
| 2432380 | 1/1976 | Fed. Rep. of Germany . |
| 2747536 | 4/1979 | Fed. Rep. of Germany . |
| 0109557 | 10/1983 | Fed. Rep. of Germany . |
| 3409022 | 9/1985 | Fed. Rep. of Germany . |
| 3417451 | 11/1985 | Fed. Rep. of Germany . |
| 1-265599 | 10/1989 | Japan ............ 361/415 |
| 0202467 | 7/1982 | PCT Int'l Appl. . |
| 0364416 | 8/1989 | Sweden . |

OTHER PUBLICATIONS

IBM Technical Disclosure Bulletin (TDB) vol. 27, 7B, (Dec. 1984), pp. 4218-4221,"Spartan I and I(R) Second Level Technology Packages", by Goodman et al.
IBM TDB vol. 30, No. 6 (Nov. 1987), p. 263, "One--Piece, Card Guide For Multiple Circuit Card Installation In Personal Computers", by Ansell et al.
IBM TDB vol. 30, No. 12 (May 1988), pp. 308-309, "Card On Board Support System", by Brodsky et al.
IBM TDB vol. 31, No. 7 (Dec. 1988), pp. 359-361, "Logic Cage For Covered Logic Cards And Other Components", by Casanova et al.
IBM TDB vol. 31, No. 7 (Dec. 1988), pp. 364-369, "Logic Cage For Accepting A Multiplicity Of Covered Logic Cards", by Casanova et al.

Primary Examiner—Leo P. Picard
Assistant Examiner—D. Sparks
Attorney, Agent, or Firm—Lawrence R. Fraley

[57] ABSTRACT

An electronic cage for housing electronic components (circuit boards and power supplies) therein, wherein the cage includes a box-like component receiving area defined by a plurality of upstanding side walls and a floor member. Part of the floor member projects from the box-like receiving area to thus expose various electronic devices (e.g., modules, connectors) located on a common, large board which may be positioned within the cage. Significantly, the cage is of one-piece construction, preferably of injection molded structural foam.

13 Claims, 4 Drawing Sheets

ONE-PIECE ELECTRONIC CAGE

TECHNICAL FIELD

This invention relates to enclosure structures for containing and supporting various electronic components such as circuit boards and power supplies, and particularly those structures for use in information handling systems (computers). Such enclosures are also referred to in the computer art as electronic cages.

BACKGROUND OF THE INVENTION

Various electronic cage structures are known in the art, with examples defined in U.S. Pat. Nos. 3,231,785 and 4,984,133, and also described in International Business Machines Corporation Technical Disclosure Bulletins Vol. 27, No. 7B (Dec., 1984), pp., 4218–4221 and Vol. 31, No. 7, (Dec., 1988), pp. 364–369. Typically, these structures are comprised of several individual pieces, usually metal (e.g., aluminum, stainless steel), formed to the desired configuration by known metal working techniques (e.g., stamping, casting, etc.). Assembly is thus necessary to join these pieces to form the final desired structure, such assembly often requiring even further elements (e.g., screws, nuts, bolts) to secure various pieces. Should additional strength be necessary at various locations in the structure (e.g., to provide component guide means, added structural support for facilitation of cage securement to an associate frame, etc.), additional reinforcement elements are typically added for this purpose. The result is a finished structure, which, understandably, is relatively heavy as well as relatively time-consuming and otherwise expensive to produce. Because several individual elements are required, tolerance control has also been somewhat difficult to maintain, which control is particularly important in such structures (e.g., for aligning various internal components). Such structures have heretofore also typically been relatively difficult to access the internal areas thereof (e.g., in the event of repair) due primarily to the need for time-consuming disassembly operations.

It is believed, therefore, that an electronic cage which overcomes the various disadvantages associated with cages such as described above would constitute a significant advancement in the art.

DISCLOSURE OF THE INVENTION

It is a primary object of this invention to enhance the art of electronic cages and particularly of those for use in the computer field.

It is a more particular object of this invention to provide an electronic cage which is both strong and lightweight, yet which can be produced at relatively less cost in both time and material, than typical cages of the prior art.

It is a still further object of the invention to provide such an electronic cage which provides for relative freedom of access to selected portions thereof, as well as for relative ease of removal of the various components (e.g., circuit boards, power supplies, etc.) supported and contained therein.

It is yet another object of this invention to provide an electronic cage possessing the above advantageous features and which, significantly, is of one-piece, lightweight construction, thereby further assuring relatively tight tolerance controls in the finished product.

In accordance with one aspect of the invention, there is provided an electronic cage comprising a floor member including first and second substantially adjacent portions, the floor member adapted for having a first circuit board positioned on both first and second portions thereof, and a plurality of side walls extending substantially upwardly from the first portion of said floor member, the first portion and side walls defining a substantially box-like electronic component receiving area for receiving and housing at least one second circuit board therein. The second portion of the floor member is substantially planar and projects outwardly from said substantially box-like receiving area such that the part of the first circuit board positioned thereon is substantially readily accessible. The electronic cage is of one-piece construction, to thus assure a lightweight end product having close tolerance control.

BEST MODE FOR CARRYING OUT THE INVENTION

For a better understanding of the present invention together with other and further objects, advantages and capabilities thereof, reference is made to the following disclosure and appended claims in connection with the above-described drawing.

Figure 1:
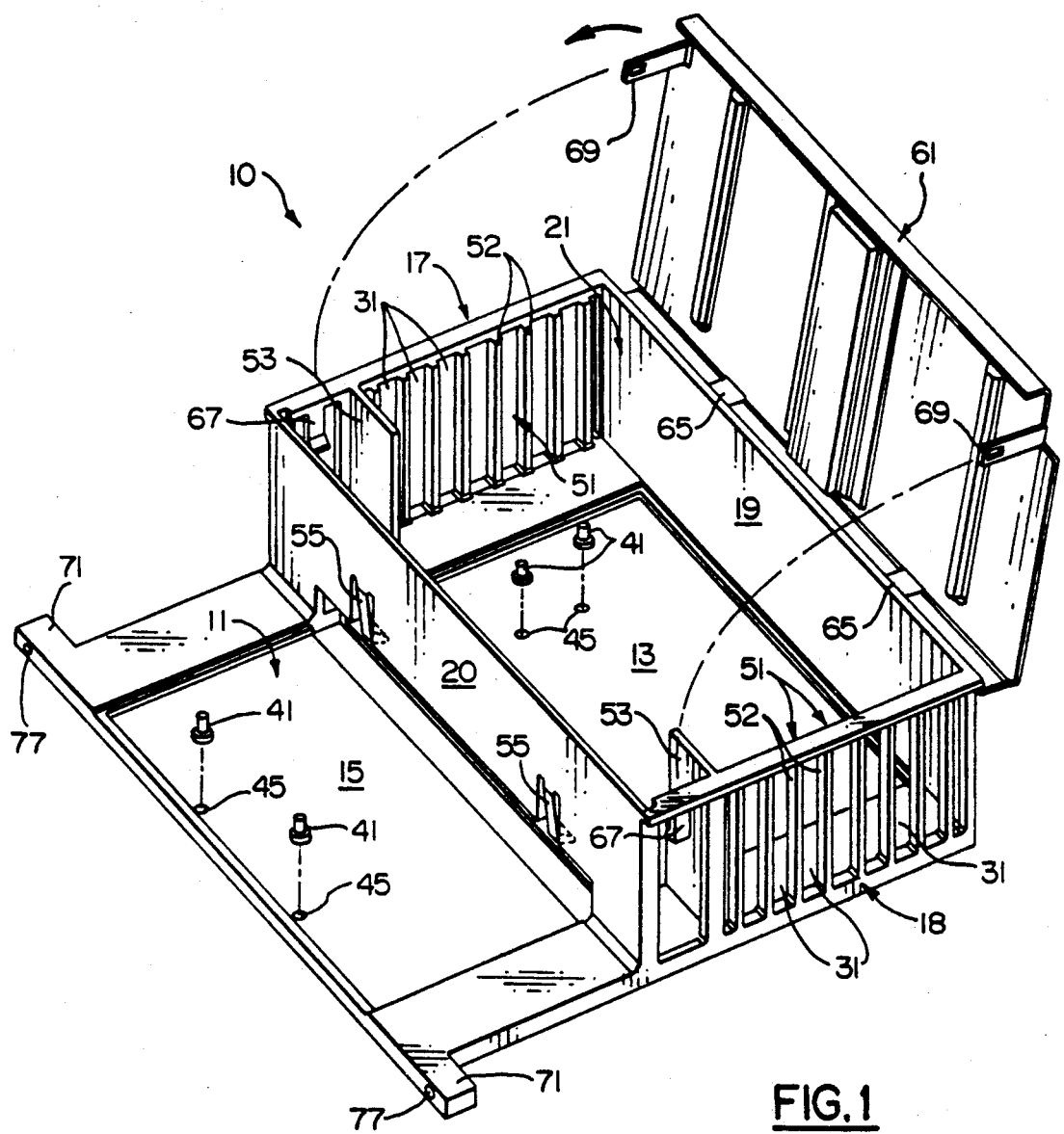
FIG. 1 is a perspective view of a one-piece electronic cage in accordance with one embodiment of the invention, the cage including a separate cover located thereon.

In FIG. 1, there is shown an electronic cage 10 in accordance with a preferred embodiment of the invention. Cage 10 comprises a floor member 11 which, as shown, extends substantially across the entire bottom portion of cage 10. As further defined herein, floor member 11 includes a first portion 13 and a substantially adjacent second portion 15. In a preferred embodiment, floor member 11 is substantially planar, with both portions being contiguous.

Cage 10 further includes a plurality (e.g., four) of side walls 17, 18, 19 and 20 which, as shown in FIG. 1, combine with the substantially solid second portion 13 of floor member 11 to define a substantially box-like electronic component receiving area 21 for receiving and housing at least one, and preferably several, individual electronic components therein.

By the term electronic component as used herein is meant to include known circuit board structures (a/k/a printed circuit boards or printed wiring boards), including those having various electronic devices (e.g., modules, connectors, etc.) located thereon. Examples of such circuit board structures are illustrated in U.S. Pat.

Figure 2:
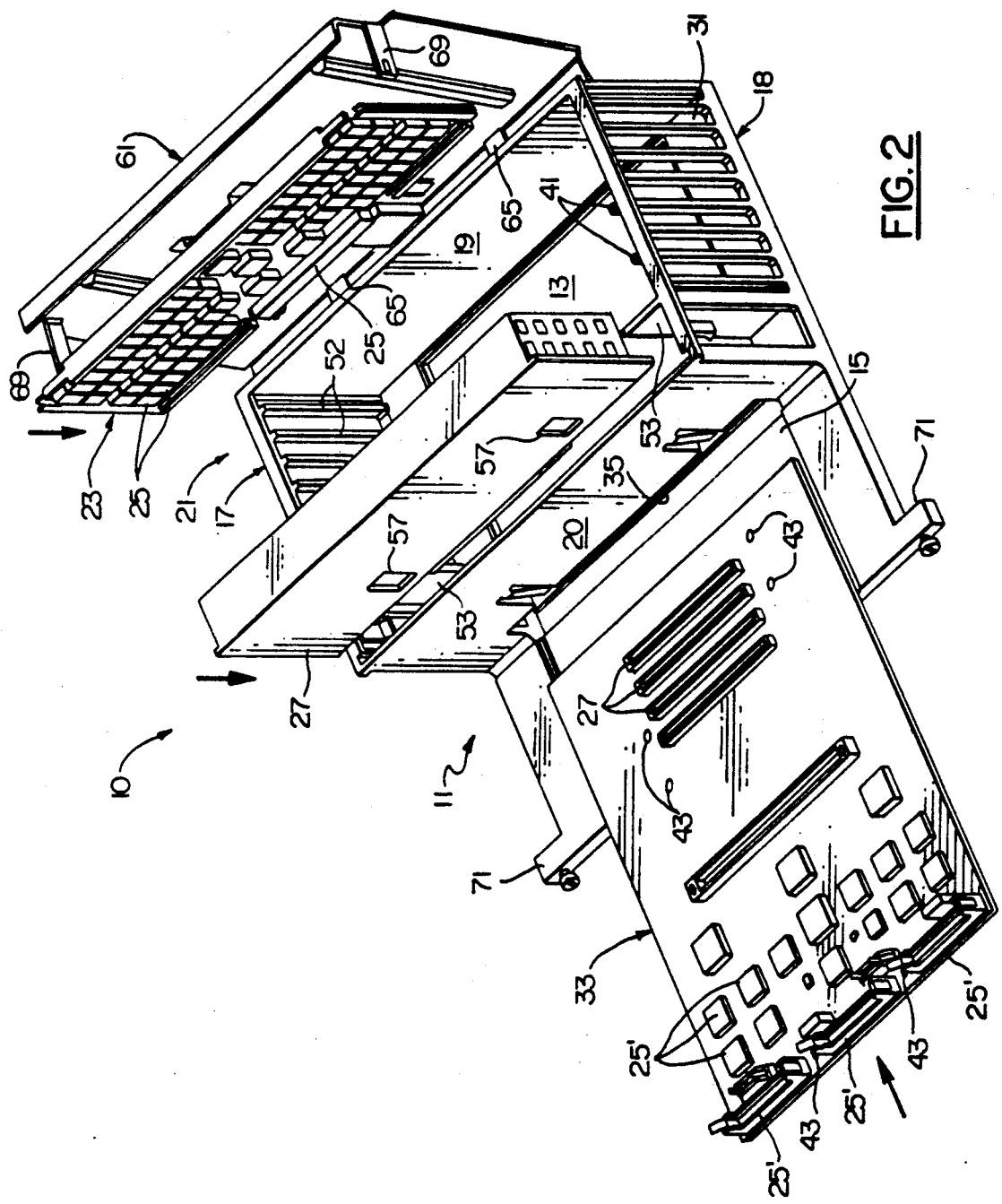
FIG. 2 is a perspective view of the cage of FIG. 1, illustrating various electronic components about to be positioned therein.

Nos. 4,131,933 (R. Agard et al) and 4,864,458 (G. Demorat, Jr. et al), both assigned to the same assignee as the present invention. These patents are incorporated herein by reference. Typically, such structures include a planar circuit board of substantially rectangular configuration and include such electronic devices on at least one surface thereof. Attention is directed to FIG. 2, wherein such a circuit board 23, including a plurality of electronic devices 25 thereon, is shown about to be positioned within cage 10. Such circuit boards as adapted for being positioned within cage 10 may further include additional structure (e.g., to prevent electrostatic discharge, as in U.S. Pat. No. 4,864,458, to provide reinforcement, etc.). The term electronic component is also meant to include power supplies or similar structures, which may also be positioned with electronic cages. One example is represented by the numeral 27 and shown in FIGS. 2 and 3. Power supplies are well known in the art and further description not believed necessary.

By the term electronic devices as used herein is meant to include various electrical structures which may be positioned on circuit boards, particularly including modules, connectors, etc. By the term module as used herein is meant to define a packaged functional hardware unit designed for use with other electronic devices, such modules also referred to as logic and memory modules. Examples of such structures are described in U.S. Pat. Nos. 4,514,752 (P. Engel et al) and 4,962,416 (A. Jones et al), both assigned to the same assignee as the present invention. Both of these patents are incorporated herein by reference. It is understood that a variety of electronic devices, including modules of the type cited above, may be included on the circuit boards for being positioned within the present invention. Understandably, power supplies as mentioned above and shown are typically of substantially larger construction than the aforementioned modules and, as stated, are capable of being individually positioned within cage 10. The power supply 27 depicted in FIG. 2 is of substantially box-like configuration and includes various electronic device (e.g., modules) as part thereof, as is typical of power supplies of the current art. Such a power supply may also include at least one circuit board therein, this board having such devices mounted thereon. It is thus understood that the substantially box-like electronic component receiving area 21 of cage 10 is also specifically designed for having individual electronic components, such as power supply 27, positioned and retained therein.

As further seen in FIG. 1, the first portion 15 of floor member 11 projects outwardly from the box-like component receiving area 21 defined by walls 17-20 and first portion 13. This is considered a significant feature of the invention for reasons further explained below.

As shown in FIG. 1, the outwardly projecting planar second portion 15 of floor 11 is substantially perpendicular to the upstanding side wall 20, which wall lies along the interface between portions 13 and 15. All of the walls 17-20 are also substantially perpendicular to the first portion 13. In a preferred embodiment, the opposed walls 17 and 18 are parallel and, as further defined below, include a plurality of openings 31 therein for permitting cooling (e.g., by air passage) to the cage's internally contained components. Further, the opposed pair of side walls 19 and 20 are also preferably parallel and, significantly, of substantially solid configuration (not including cooling openings or the like. Of such substantially solid side walls, side wall 20 is deemed particularly significant with regard to the present invention. This solid side wall, as located, serves to substantially reinforce the overall cage structure at this location while further substantially preventing side wall "rotation" when the cage is positioned within the desired housing assembly designed to accommodate same. This is especially true when cage 10 is located on its side (e.g., on side wall 17 or 18, as defined further below). Examples of such assemblies may include what are referred to in the art as intermediate processor units, several types of which are manufactured and sold by the assignee of the present invention. Typically, such processor units may include more than one cage assembly as part thereof.

Figure 3:
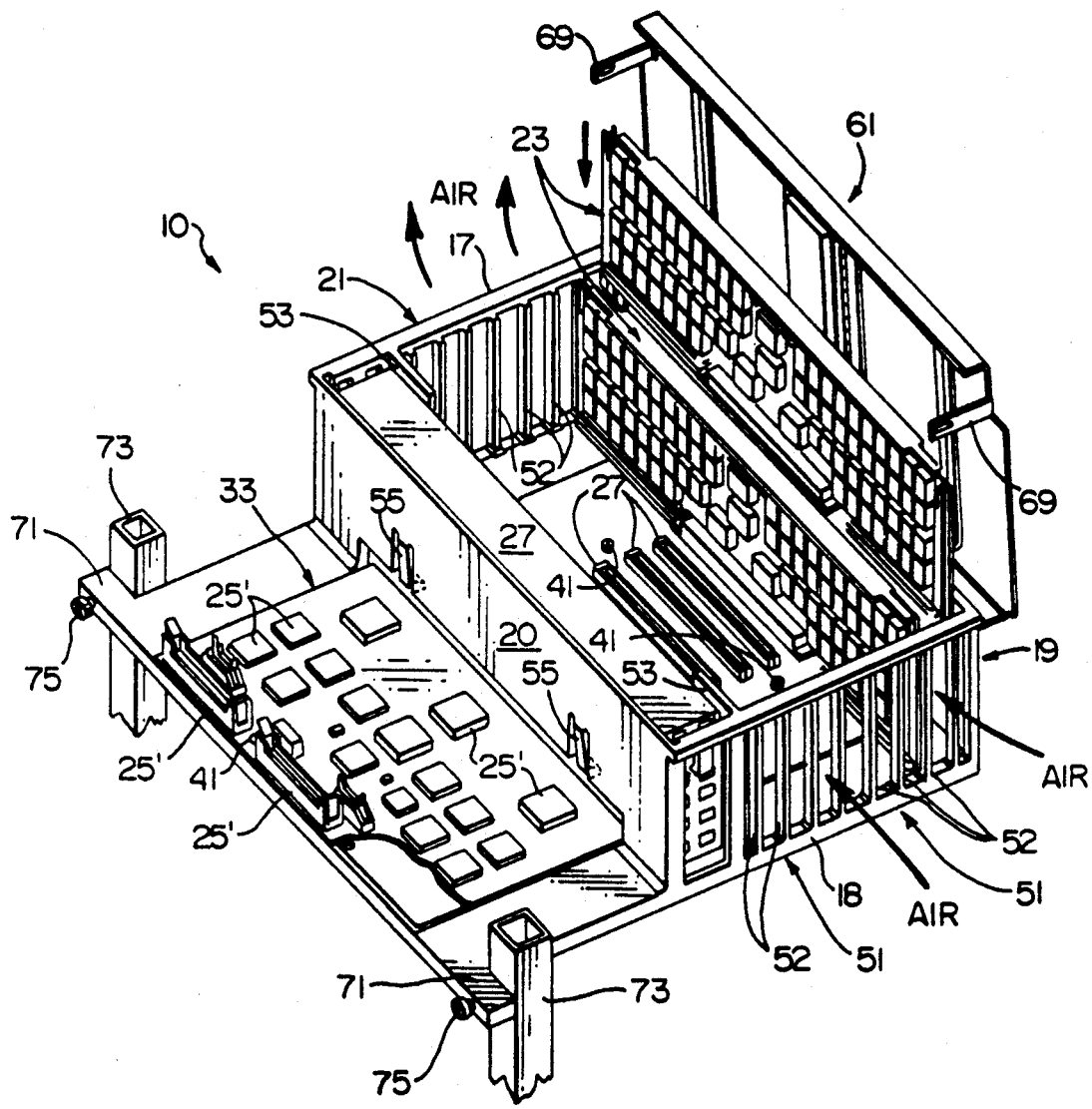
FIG. 3 is a perspective view of the cage of FIGS. 1 and 2, having some of the various electronic components mentioned above fully positioned and contained therein, this view also illustrating an additional component about to be finally positioned and contained.

In FIG. 2, cage 10 is shown about to receive the aforementioned circuit board 23 and adjacent power supply 27 within the box-like component receiving area 21 thereof. Prior to positioning of these members, however, cage 10 is designed to receive therein yet another circuit board, referenced by the numeral 33. This circuit board 33, like board 23, also includes a plurality of electronic devices such as modules and connectors 25'. Board 33, as shown, is preferably substantially larger than the individual boards 23 and, like boards 23, also preferably of planar configuration. Board 33 further includes a plurality of receiving connectors 27, each designed for receiving a respective one of boards 23 therein for providing electrical connection between boards 23 and the common (or mother) board 33. Such a board 33-board 23 relationship may also be referred to as a mother-daughter arrangement. Significantly, the larger board 33 is capable of being slidably positioned within the lower portion of cage 10 so as to be located on both first and second adjacent portions 13 and 15. This is accomplished by providing an elongated slot 35 within the lower portion of solid side wall 20. The various electronic devices (e.g., connectors 27) on the portion of board 33 finally positioned on first portion 13 are of such height so as to enable such slidable positioning. Once fully positioned as depicted in FIG. 3, the part of board 33 including the aforementioned electronic devices 25', is positioned on the floor member's second portion 15 and thus so extends from the box-like receiving area 21. Significantly, this arrangement provides for ready access to such components 25' to enable repair and/or replacement thereof in a facile manner.

In one embodiment of the invention, the modules which form components 25' were logic modules, these modules positioned on the exposed part of board 33 by known attachment techniques. The connectors which form these components may also be attached using known techniques. When board 33 is fully inserted within cage 10, some means of retention is used to fixedly position the board in place. A preferred means for accomplishing this is to utilize a plurality of retention plugs 41 (FIG. 1) which may be positioned on floor member 11 at designated locations for being inserted within respective receiving holes (apertures) 43 within board 33. In one example, a total of seven such plugs 41 were utilized. Plugs 41 may also be inserted from beneath the floor member 11 and pass through provided apertures 45 within the floor at designated locations. Such apertures 45 would in turn align with apertures 43 in board 33 and the individual plugs each inserted through aligned pairs thereof so as to effect board retention. Such a fit between plug and board would, understandably, be frictional in nature.

Once board 33 has been fully positioned and secured within cage 10, the various circuit boards 23 and power supply 27 may then be positioned within component receiving area 21. To facilitate such positioning, the opposed pair of side walls 17 and 18 further include guide means 51 in the form of upstanding parallel walls 52 therein. Understandably, a pair of such parallel walls 52, defining an elongated channel therebetween, is designed for receiving a respective edge portion of a respective one of the incoming circuit boards 23. Thus, each board is slidably engaged at opposing edge portions thereof to guide the board such that connection is made to the larger board 33. In one example of the invention, cage 10 received a total of eight individual circuit boards 23, thus providing a total of eight pairs of parallel walls within each side wall 17 and 18 for guiding these circuit boards into position. Because some walls provide common functioning in this regard (serve as a common wall in two adjacent pairs), a total of nine such walls 52 are required in each side wall, minimally, to receive a total of eight boards.

For receiving the power supply 27, at least one (and preferably two) of the opposed side walls includes a partition 53 extending therefrom. As better seen in FIG. 1, two such partitions 53 are provided, each partially extending within the open receiving area 21. These two partitions 53 and parallel side wall 20 thus define an individual electronic component receiving area within the larger area 21, for power supply 27. As shown in FIG. 1, such an area is in the form of an elongated slot or the like for receiving the substantially box-like power supply 27. The solid side wall 20 further includes a pair of latch members 55 spacedly located therein, each designed for being positioned within a corresponding opening 57 provided within the outer casing of power supply 27. It is thus seen that integral latch members 55, which form part of the substantially solid side wall 20, thus serve to "capture" the power supply 27 and thereby securedly retain this component within cage 10.

In accordance with the teachings herein, cage 10, including the aforementioned floor, side wall, partition, guide structure (walls 51) and latch members are, significantly, formed as a one-piece component. In a preferred embodiment, cage 10 is produced by injection molding, and of a material referred to as structural foam. Such material is capable of being successfully injection molded and provides sufficient structural integrity and strength to effectively contain the various electronic components described herein within the confines thereof. In a preferred example, cage 10 was made from a polyphenylene oxide resin type of structural foam, one example being Noryl FM3020, available from the General Electric Company, Pittsfield, Massachusetts. (Noryl is a trademark of General Electric Company.) This structural foam material further includes approximately 30 percent by weight glass reinforcement, a tensile strength (yield) of about 10,500 pounds per square inch (psi), flexural strength (Yield) of about 15,200 psi and a solid specific gravity of about 1.32 (in comparison to a foam specific gravity of 1.19). As stated, cage 10 is preferably produced by injection molding. To attain the structure of the material described herein, the injection mold is filled with the polyphenylene oxide resin and the appropriate percentage of glass fibers added thereto. Additionally, an inert gas (e.g., nitrogen) is added to give desired porosity to the final product. The result is a finished structure with, significantly, substantially solid outer portions and porous internal portions The resulting structure is lightweight and strong. Of further significance, the structure, being molded and thus of one-piece construction, provides for extremely tight tolerancing between the various surfaces of the structure.

It is understood that plastic material other than that mentioned above (Noryl FM3020) may be successfully utilized in the present invention. The invention is thus not limited to this particular material.

Utilization of an integral, injection molded cage assures other advantages, in addition to those above. For example, it is possible in such a structure to provide added reinforcement to designated locations therein (e.g., receiving area 21) without adding significant weight to the overall structure. Such additional weight is typically required in multi-piece (e.g., stainless steel) structures of the prior art. Such a strong structure also enables positioning of cage 10, including its internal components, in a position other than substantially horizontal, as is typical in prior art cage assemblies. Specifically, the invention as taught herein is capable of being readily positioned on its side such that one of the side walls (e.g., side wall 18) may rest upon a suitable horizontal ledge or the like within the designated processor unit. In such an arrangement, the opposed solid side walls 19 and 20 would thus be oriented substantially vertically within the processor. This is unlike many other cage orientations wherein the internal large circuit board (a/k/a planar) and the associated lower portion of the cage are oriented substantially horizontally. Understandably, in the side orientation described above, the larger board 33 will also assume a substantially vertical position within the designated processor unit.

As stated, cage 10 is relatively lightweight. In various examples of the invention, cage 10 (excluding the various electronic components positioned therein) may possess a weight of within the range of only from about two to about six pounds. In one particular example, the plastic cage had a weight of only about 3.9 pounds. This cage thus weighs substantially less than typical metallic, multi-piece cage structures of the prior art, which usually weigh from about eight to about twelve pounds. Such a reduction in weight is, understandably, considered substantial. In the above example (wherein cage 10 weighed 3.9 pounds), the cage processed external dimensions of about 14 inches (length) by 14 inches (width), with a height of only about 5 inches.

In FIGS. 1-4, there is shown a separate cover member 61 which may be utilized with the one-piece cage 10 to provide a cover for the circuit board members and other electronic components positioned within the cage's receiving area 21. Cover 61, as stated, is a separate structure and preferably of plastic material, a suitable example being a polycarbonate plastic including a carbon filler additive (to render the cover static dissipative). Cover member 61, as best seen in FIG. 1, is designed for being pivotally positioned on one of the upstanding side walls (19), with one side thereof including a pair of apertures 63 (FIG. 4) therein. A corresponding pair of projecting latch segments 65 also integrally formed as part of cage 10, are designed for aligning with and being positioned within the respective apertures 63 such that the separate cover 61 may pivot thereabout. Retention of cover 61, in the closed position, is assured through a pair of latch elements 67 which, like latch member 55, form an integral portion of cage 21 and are located on opposing sides 17 and 18 in the area designed for accommodating the power supply 27. When cover 61 is fully closed, respective aperture tabs 69 thereon align with and engage the corresponding pair of latch segments 67 to retain the cover in a closed position. Cover 61, being plastic, is also extremely lightweight and, in one example of the invention, possessed a total weight of only about 4.5 pounds.

Figure 4:
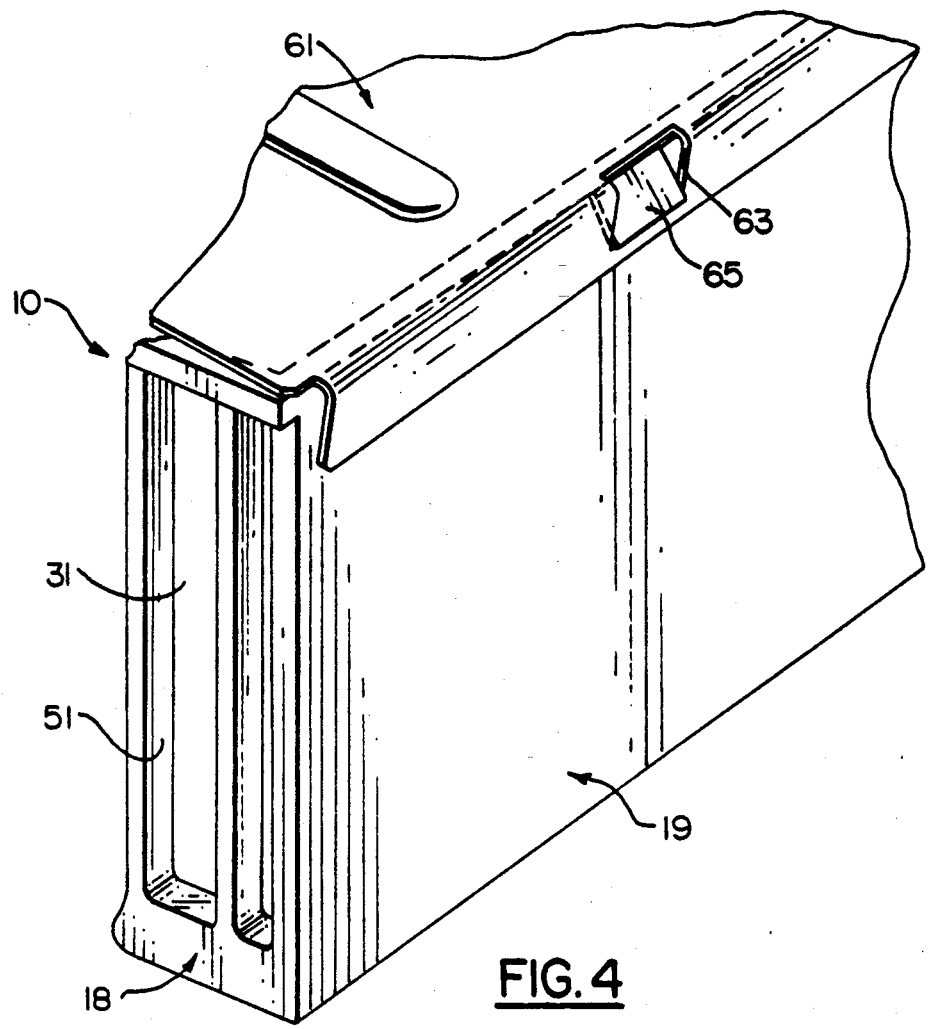
FIG. 4 is an enlarged, partial perspective view of the cage of FIG. 1, illustrating the separate cover positioned thereon.

Although only one aperture 63 is illustrated in FIG. 4, it is understood that another aperture, of similar configuration, is spacedly positioned along the same edge of cover 61 to accommodate the spaced second latch member 65. Both such latch members 65, as mentioned, are shown in FIGS. 1 and 2 of the drawings and the second aperture 63 is thus understood to be located relative to the second of these.

Figure 5:
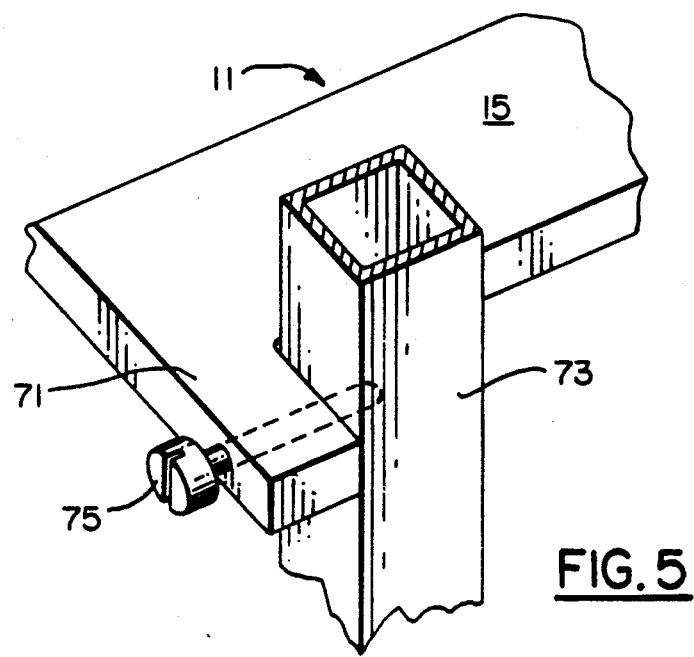
FIG. 5 is an enlarged, partial perspective view of the cage of FIG. 1, and particularly the means for securing the cage to a frame or the like associated with the final assembly (e.g., a processor unit) in which the invention may be positioned.

In FIG. 5, there is shown an enlarged view of a means for securing cage 10 to the frame or similar structure of the electrical assembly (e.g., processor unit) into which cage 10 is to be positioned. In one embodiment of the invention, a pair of projecting flange members 71 are provided at the outer portion of second portion 15 of floor 11. See particularly FIGS. 1-3. Each flange 71 is designed for aligning with a respective frame member 73 or the like of the corresponding processor unit. The protruding flanges 71 may be secured to each respective frame member using a screw 75 or the like, as shown in FIGS. 3 and 5. Each flange 71 includes an opening 77 (FIG. 1) therein to accommodate such a screw. Significantly, it has been determined that attachment of cage 10 to such a frame structure can be successfully accomplished utilizing only the described pair of flange members and associated screws or the like for attaching same as indicated. As mentioned above, the cage may be positioned within the processor frame by placement of the larger, box-like electronic component-receiving portion thereof atop a ledge or similar surface designed to accommodate same. Once so positioned, the respective flanges 71 are then secured to the processor's frame members. It is thus understood that securement as well as removal of cage 10 can be relatively easily accomplished.

Thus there has been shown and described an electronic cage which is of relatively lightweight construction, yet which is sufficiently strong and rigid so as to include several circuit board assemblies and other related electrical components therein in a positive manner. The cage as defined herein also provides positive means for guiding such circuit boards and other components therein, while even further providing means for engaging and locking with associated structure (e.g., a cover). Significantly, the cage as described herein provides a readily accessible front part wherein various components located on a large circuit board or the like positioned within the cage are in turn readily accessible (e.g., for repair and/or replacement).

While there have been shown and described what are at present considered the preferred embodiments of the invention, it will be obvious to those skilled in the art that various changes and modifications may be made therein without departing from the scope of the invention as defined by the appended claims.

What is claimed is:

1. An electronic cage comprising:
a substantially planar floor member including first and second substantially adjacent portions, said floor member adapted for having a first circuit board positioned on both said first and second portions thereof; and
a plurality of side walls extending substantially upwardly from said first portion of said floor member, said first portion and said side walls defining a substantially box-like, electronic component receiving area for receiving and housing at least one second circuit board there, at least two of said side walls including guide means therein for guiding said second circuit board into said box-like electronic component receiving area, said second portion of said floor member being substantially planar and projecting outwardly from said substantially box-like, electronic component receiving area such that when said first circuit board is positioned on said floor member the part of said first circuit board positioned on said second portion of said floor member is substantially readily accessible, said electronic cage being of one-piece construction and comprised of plastic material.

2. The electronic cage according to claim 1 wherein said plastic material is structural foam.

3. The electronic cage according to claim 1 wherein said guide means on each of said side walls comprises a pair of upstanding walls defining an elongated channel therebetween adapted for receiving an edge of said second circuit board.

4. The electronic cage according to claim 1 further including at least one partition extending from one of said side walls, said partition, first portion of said floor member and at least one other side wall defining an individual electronic component receiving area for receiving and housing a singular electronic component therein.

5. The electronic cage according to claim 4 wherein said one other side wall includes retention means therein adapted for engaging said singular electronic component to assist in retaining said singular electronic component within said individual electronic component receiving area.

6. The electronic cage according to claim 5 wherein said retention means comprises at least two latch members spacedly located within said one other side wall.

7. The electronic cage according to claim 1 further including a plurality of openings within selected ones of said side walls to enable passage of air through said box-like electronic component receiving area to permit cooling said second circuit board when said second circuit board is housed therein.

8. The electronic cage according to claim 1 wherein said first and second portions of said floor member are contiguous, one of said side walls substantially lying along the interface between said first and second portions and including a slot therein for facilitating positioning of said first circuit board on said floor member.

9. The electronic cage according to claim 1 further including a separate cover member for providing a cover for said box-like electronic component receiving area, said cage further including means for retaining said cover thereon.

10. The electronic cage according to claim 9 wherein said mean for retaining said cover comprises at least two latch segments spacedly located on one of said side walls.

11. The electronic cage according to claim 1 wherein said substantially planar second portion of said floor member includes means thereon for permitting securement of said cage to a frame or similar structure.

12. The electronic cage according to claim 11 wherein said means for permitting said securement comprises a pair of projecting flange members.

13. The electronic cage according to claim 1 further including separate means for retaining said first circuit board in position on said floor member comprising a plurality of plug members, said floor member and said first circuit board including apertures therein, said apertures within said floor member adapted for being aligned with respective apertures within said first circuit board, each of said plug members adapted for being located within a respective pair of aligned apertures.

* * * * *